(12) United States Patent
Lodden et al.

(10) Patent No.: US 10,335,978 B2
(45) Date of Patent: Jul. 2, 2019

(54) FABRICATION OF THREE-DIMENSIONAL STRUCTURES USING REFLOWED MOLDING

(71) Applicant: Honeywell International Inc., Morris Plains, NJ (US)

(72) Inventors: Grant Lodden, Minnetrista, MN (US); Xiao Zhu Fan, Plymouth, MN (US)

(73) Assignee: Honeywell International Inc., Morris Plains, NJ (US)

( * ) Notice: Subject to any disclaimer, the term of this patent is extended or adjusted under 35 U.S.C. 154(b) by 421 days.

(21) Appl. No.: 15/169,110

(22) Filed: May 31, 2016

(65) Prior Publication Data

US 2017/0341932 A1 Nov. 30, 2017

(51) Int. Cl.
*B32B 27/00* (2006.01)
*B28B 1/30* (2006.01)
(Continued)

(52) U.S. Cl.
CPC ............ *B28B 1/30* (2013.01); *B81C 1/00103* (2013.01); *B81C 99/009* (2013.01);
(Continued)

(58) Field of Classification Search
CPC . C03B 23/35; C03B 23/0235; B81B 2201/05; B81B 2201/04; B81C 1/00;
(Continued)

(56) References Cited

U.S. PATENT DOCUMENTS 8,138,019 B2 3/2012 Yoon et al.
8,707,734 B2 4/2014 Haque et al.
(Continued)

FOREIGN PATENT DOCUMENTS

CN 102491258 * 6/2012
CN 104401934 3/2015

OTHER PUBLICATIONS

Overview of CMP Technologies for MEMS Applications, Jan. 13, 2011, MEMS Journal, http://www.memsjournal.com/2011/01/an-overview-of-cmp-technologies-for-mems-applications.html, p. 1-2 (Year: 2011).*

(Continued)

*Primary Examiner* — William P Bell
*Assistant Examiner* — Andrew L Swanson
(74) *Attorney, Agent, or Firm* — Fogg & Powers LLC

(57) ABSTRACT

A method of fabricating three-dimensional (3D) structures comprises forming a patterned area in a handle wafer, and bonding a mold wafer over the patterned area to produce one or more sealed cavities having a first pressure in the handle wafer. The mold wafer is heated past its softening point at a second pressure different from the first pressure to create a differential pressure across the mold wafer over the sealed cavities. The mold wafer is then cooled to harden the mold wafer into one or more 3D shapes over the sealed cavities. One or more materials are deposited on an outer surface of the mold wafer over the 3D shapes to form a structure layer having 3D structures that conform to the hardened 3D shapes of the mold wafer. The 3D structures are then bonded to a device wafer, and the handle wafer is removed to expose the 3D structures.

20 Claims, 4 Drawing Sheets

(51) Int. Cl.
  *G02B 3/00* (2006.01)
  *B81C 1/00* (2006.01)
  *B81C 99/00* (2010.01)
  *H01L 27/146* (2006.01)
(52) U.S. Cl.
  CPC ........ *G02B 3/0018* (2013.01); *B81C 1/00634* (2013.01); *H01L 27/14685* (2013.01); *H01L 27/14687* (2013.01)
(58) Field of Classification Search
  CPC . B81C 1/0038; B81C 1/00634; H01L 27/146; H01L 27/14625; H01L 27/14627; G02B 3/0018; B29B 1/30
  See application file for complete search history.

(56) References Cited

U.S. PATENT DOCUMENTS

| | | | |
|---|---|---|---|
| 9,249,015 | B2 | 2/2016 | Kinser et al. |
| 2008/0280124 | A1* | 11/2008 | Eklund ................. C03B 23/02 428/315.9 |
| 2012/0285198 | A1 | 11/2012 | Shang |
| 2013/0323840 | A1 | 12/2013 | Lee et al. |
| 2015/0131034 | A1 | 5/2015 | Cho et al. |
| 2016/0194200 | A1* | 7/2016 | Najafi ................. C03B 23/02 65/106 |
| 2017/0248422 | A1* | 8/2017 | Najafi ................. C03B 23/0252 |

OTHER PUBLICATIONS

Spear, Diamond—Ceramic Coating of the Future, 1989, Journal of the American Ceramic Society, vol. 72 No. 2, p. 187 (Year: 1989).*
European Patent Office, "Extended European Search Report for EP Application No. 17170019.8", Foreign counterpart to U.S. Appl. No. 15/169,110, dated Oct. 25, 2017, pp. 1-3, Published in: EP.
Haque et al., "A Glass-in-Silicon Reflow Process for Three-Dimensional Microsystems", Journal of Microelectromechanical Systems, Dec. 2013, pp. 1470-1477, vol. 22, No. 6, Publisher: IEEE.
Nagourney et al., "Micromachined High-Q Fused Silica Bell Resonator With Complex Profile Curvature Realized Using 3D Micro Blowtorch Molding", Transducers 2015, Jun. 21-25, 2015, pp. 1311-1314, Publisher: IEEE, Published in: Anchorage, AK.

* cited by examiner

FABRICATION OF THREE-DIMENSIONAL STRUCTURES USING REFLOWED MOLDING

BACKGROUND

Traditional microfabrication processes are primarily suited for two-dimensional (2D) designs. These processes have excellent in-plane dimension control due to precise lithography but very limited out-of-plane dimension control. The only out-of-plane dimension control available is the layer thickness or depths of etches. Thus, 2D patterning places constraints on potential device designs and applications.

Smooth, rounded out-of-plane structures are particularly difficult to construct using conventional microfabrication techniques. Grayscale lithography is a common technique employed to fabricate three-dimensional (3D) microstructures. However, the grayscale lithography process is very expensive and suffers from low out-of-plane resolution.

Smooth, rounded microstructures have been fabricated via two different material reflow processes. The first process includes heating a material above its softening temperature, which allows surface molecules of the material to reorganize into a lower surface energy state. As a result, sharp and corner edges are rounded and surface roughness is reduced. The rounded microstructure is maintained when the temperature is lowered, solidifying the reflowed structure.

The second process also includes heating a material above its softening temperature to reflow it in-to or out-of cavities etched in a handle wafer. The direction of reflow depends on the differential pressure applied across the material. The differential pressure is controlled by varying the chamber pressure when the reflow material is bonded to the handle wafer. Other environmental conditions are used to manipulate the shape of the reflowed material such as reflow temperature, reflow time, material type, and the like. The material is then fixed in a final state by cooling below the softening point. The elevated temperature during the reflow process allows for minimization of the material's surface energy, resulting in rounded corners and edges with minimal surface roughness.

Unfortunately, these reflow processes are limited in the number of material sets that are compatible. For instance, materials with very high softening temperatures are not compatible with the processes above because of the difficulty of finding a handle wafer that survives an extremely high reflow temperature. Furthermore, the reflow process requires materials that are amorphous and inert such that the material retains its chemical composition and material properties during the reflow step.

SUMMARY

A method of fabricating one or more three-dimensional (3D) structures comprises forming a patterned area in a handle wafer, and bonding a mold wafer over the patterned area to produce one or more sealed cavities having a first pressure in the handle wafer. The mold wafer is heated past a softening point of the mold wafer at a second pressure different from the first pressure to create a differential pressure across the mold wafer over the one or more sealed cavities. The mold wafer is then cooled to harden the mold wafer into one or more 3D shapes over the one or more sealed cavities. One or more materials are deposited on an outer surface of the mold wafer over the one or more 3D shapes to form a structure layer having one or more 3D structures that conform to the hardened one or more 3D shapes of the mold wafer. The one or more 3D structures are then bonded to a device wafer, and the handle wafer is removed to expose the one or more 3D structures on the device wafer.

BRIEF DESCRIPTION OF THE DRAWINGS

Features of the present invention will become apparent to those skilled in the art from the following description with reference to the drawings. Understanding that the drawings depict only typical embodiments and are not therefore to be considered limiting in scope, the invention will be described with additional specificity and detail through the use of the accompanying drawings, in which.

DETAILED DESCRIPTION

In the following detailed description, embodiments are described in sufficient detail to enable those skilled in the art to practice the invention. It is to be understood that other embodiments may be utilized without departing from the scope of the invention. The following detailed description is, therefore, not to be taken in a limiting sense.

A method of fabricating one or more three-dimensional (3D) structures using reflowed molding is provided. The method exploits the minimal surface roughness provided by the reflow process, and circumvents limitations on materials that can be used in fabricating 3D microstructures.

The method generally includes forming one or more molds with a desired 3D shape by reflowing a mold wafer over a patterned handle wafer by controlling a differential pressure across the mold wafer, reflow temperature, reflow time, and the like. After hardening the mold via cooling, one or more materials are deposited on top of the mold wafer to form a structure layer with one or more 3D structures that conform to the molds and maintains minimal surface roughness. The conformity of the structure layer avoids the necessity to reflow the deposited material The 3D structures can be integrated with a device wafer after undergoing optional planarization and subsequent wafer to wafer bonding. The advantage of fabricating the 3D structures independent of the device wafer is that process compatibility, especially during the high temperature steps, does not need to be maintained.

The present method makes possible the formation of 3D curved microstructures fabricated from materials such as silicon, diamond, and some metals, which are unattainable via a standard reflow process due to their extremely high reflow temperatures. The present method can be used in fabricating devices for a variety of applications, such as photonics, optical micro-electrical-mechanical systems (MEMS), microfluidics, and the like. The present approach provides the benefit of a low cost, reliable microfabrication process to realize smooth 3D features using many different materials in any situation where 3D microstructures are required.

Further details of various embodiments are described hereafter with reference to the drawings.

FIGS. 1A-1H illustrate a method of fabricating one or more 3D structures using reflowed molding according to one approach. Although fabrication of a single 3D structure is shown, it should be understood that additional 3D structures can be fabricated across the wafers used during the process by repeating the patterned structures shown.

Figure 1A:
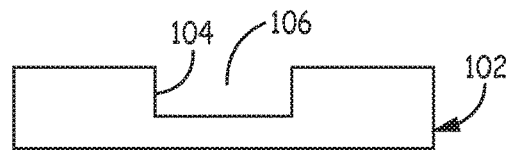
FIGS. 1A-1H are cross-sectional side views illustrating a method of fabricating one or more three-dimensional (3D) structures using reflowed molding according to one approach.

As shown in FIG. 1A, a handle wafer 102 is provided, such as a silicon handle wafer, and a patterned area 104 is formed in handle wafer 102. The patterned area 104 includes at least one cavity 106, which can be formed by an etch process, deep reactive ion etching (DRIE), wet chemical etching, or the like. Alternatively, handle wafer 102 can be composed of various glass materials such as Pyrex glass, silicon on insulator (SOI), III-V semiconductors (e.g., InP, GaAs), or the like.

Figure 1B:
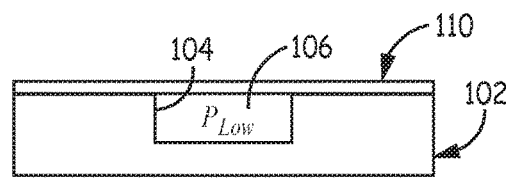

As depicted in FIG. 1B, a mold wafer 110, such as a glass wafer, is bonded to handle wafer 102 over patterned area 104 in a lower pressure environment, such that cavity 106 is sealed with a first low pressure ($P_{low}$). The mold wafer 110 can be bonded to handle wafer 102 using low temperature wafer to wafer bonding techniques. The mold wafer 110 can then be thinned and polished to a desired thickness using conventional techniques such as mechanical grinding, chemical-mechanical polishing, and/or blanket wet or dry etching. Alternatively, mold wafer 110 can be composed of various polymers, oxide materials, or the like.

Figure 1C:
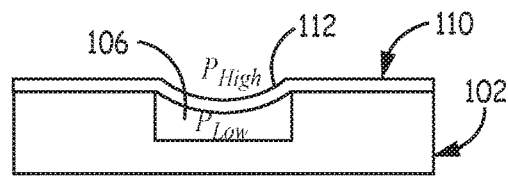

Thereafter, mold wafer 110 is heated past its softening point in a higher pressure environment ($P_{high}$) to create a differential pressure across mold wafer 110 over sealed cavity 106 at $P_{low}$. As illustrated in FIG. 1C, this results in a reflow portion 112 of mold wafer 110 being deflected into sealed cavity 106, with reflow portion 112 having a 3D curved shape. The handle wafer 102 and mold wafer 110 are then cooled to harden reflow portion 112 in the 3D curved shape over sealed cavity 106.

Figure 1D:
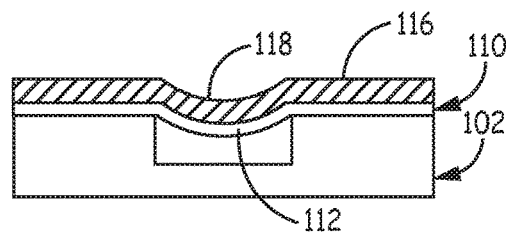

As depicted in FIG. 1D, a structure layer 116 is deposited on an outer surface of mold wafer 110 and over the hardened reflow portion 112 to form a 3D structure 118 that conforms to hardened reflow portion 112. The structure layer 116 can be formed by depositing one or more materials using various conventional deposition techniques, such as sputtering, various forms of chemical vapor deposition, thermal evaporation, or the like. Exemplary materials that can be used to form structure layer 116 include polysilicon, diamond, metals, ceramic materials, III-V semiconductors, polymers, or the like. Optionally, the structure layer 116 can be patterned after being formed if desired.

Figure 1E:
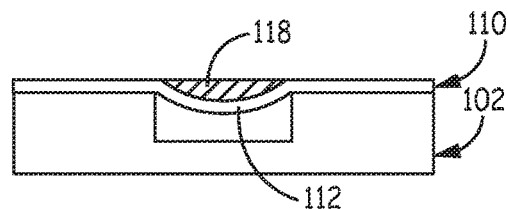

In a further optional step shown in FIG. 1E, structure layer 116 can be ground, polished, and planarized to remove excess material of structure layer 116 from the outer surface of mold wafer 110 around 3D structure 118. A standard chemical mechanical planarization (CMP) process can be used to planarize and polish the excess material.

Figure 1F:
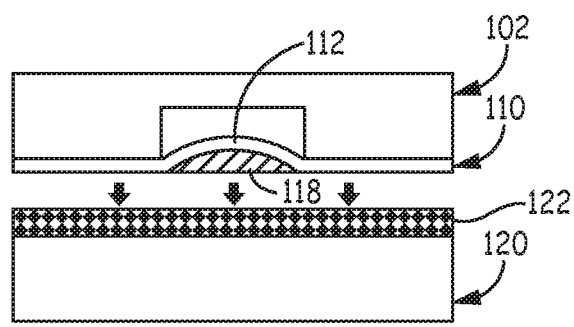
Figure 1G:
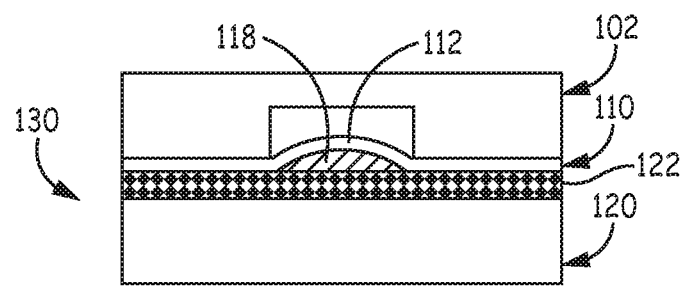

As shown in FIG. 1F, a device wafer 120 is provided on which a device layer 122 is formed and planarized by conventional processes. The device layer 122 can be, for example, a photonic layer, a microfluidic chip, or a MEMS device. The planarized surfaces of 3D structure 118 and mold wafer 110 on handle wafer 102 are bonded to device layer 122 of device wafer 120, such as by low temperature wafer to wafer bonding to produce a bonded structure 130, as depicted in FIG. 1G.

Figure 1H:
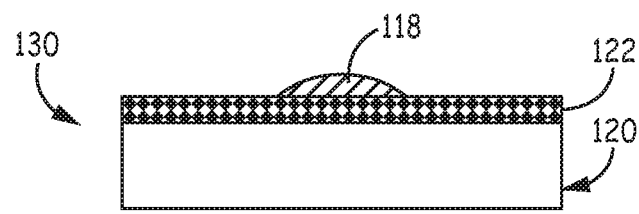

Thereafter, handle wafer 102 is removed from bonded structure 130, such as by an etch process, to expose 3D structure 118 on device layer 122. Optionally, mold wafer 110 can also be removed from bonded structure 130, such as by etching, as shown in FIG. 1H. The exposed 3D structure 118 on device layer 122 can be a microlens, an optical manipulator, or a microfluidic manipulator, for example.

Based on different pressure differences and cavity geometries, there are a variety of embodiments that can be realized using the present method. For example, FIGS. 2A-2D illustrate a method of fabricating one or more 3D structures using reflowed molding according to another approach.

Figure 2A:
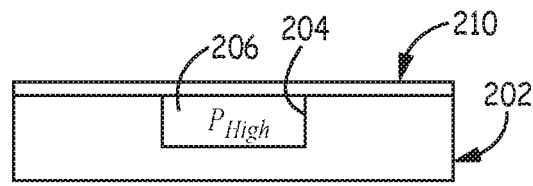
FIGS. 2A-2D are cross-sectional side views illustrating a method of fabricating one or more 3D structures using reflowed molding according to another approach.

As shown in FIG. 2A, a handle wafer 202 is provided, such as a silicon handle wafer, in which a patterned area 204 is formed that includes at least one cavity 206. A mold wafer 210, such as a glass wafer, is bonded to handle wafer 202 in a higher pressure environment, such that cavity 206 is sealed with a first high pressure ($P_{high}$). The mold wafer 210 can be bonded to handle wafer 202 using low temperature wafer to wafer bonding. The mold wafer 210 can then be thinned and polished to a desired thickness.

Figure 2B:
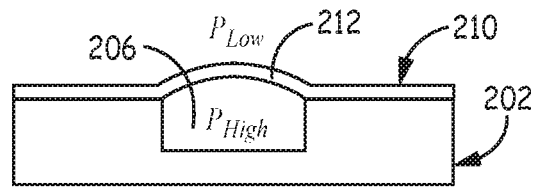

Thereafter, mold wafer 210 is heated past its softening point in a lower pressure environment ($P_{low}$) to create a differential pressure across mold wafer 210 over sealed cavity 206 at $P_{high}$. As illustrated in FIG. 2B, this results in a reflow portion 212 of mold wafer 210 being deflected away from sealed cavity 206, with reflow portion 212 having a 3D curved shape. The handle wafer 202 and mold wafer 210 are then cooled to harden reflow portion 212 in the 3D curved shape over sealed cavity 206.

Figure 2C:
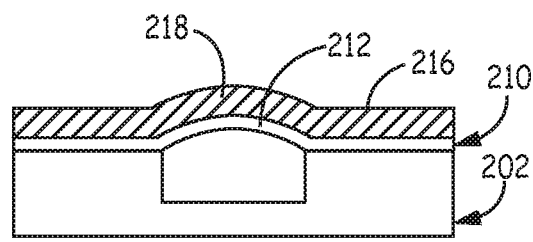
Figure 2D:
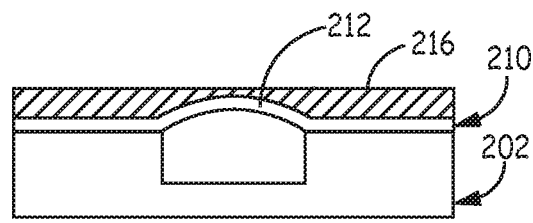

As depicted in FIG. 2C, a structure layer 216 is deposited on an outer surface of mold wafer 210 and over the hardened reflow portion 212 to form a 3D structure 218 that conforms to hardened reflow portion 212. The structure layer 216 can be formed by depositing one or more materials using various conventional deposition techniques. Optionally, structure layer 216 can be patterned after being formed if desired. In a further optional step shown in FIG. 2D, structure layer 216 can be ground, polished, and planarized to remove excess material of structure layer 216. A CMP process can be used to planarize and polish the excess material.

Thereafter, 3D structure 218 and mold wafer 210 on handle wafer 202 are bonded to a device wafer to produce a bonded structure, such as described previously for FIGS. 1F and 1G, and handle wafer 202 is removed from the bonded structure to expose 3D structure 218 on the device layer. Optionally, mold wafer 210 can also be removed from the bonded structure.

FIGS. 3A-3D illustrate another example of a method for fabricating one or more 3D structures using reflowed molding.

Figure 3A:
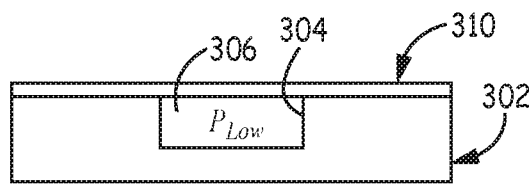
FIGS. 3A-3D are cross-sectional side views illustrating a method of fabricating one or more 3D structures using reflowed molding according to a further approach.

As shown in FIG. 3A, a handle wafer 302 is provided, such as a silicon handle wafer, in which a patterned area 304 is formed that includes at least one cavity 306. A mold wafer 310, such as a glass wafer, is bonded to handle wafer 302 in a lower pressure environment, such that cavity 306 is sealed with a first low pressure ($P_{low}$). The mold wafer 310 can be bonded to handle wafer 302 using low temperature wafer to wafer bonding. The mold wafer 310 can then be thinned and polished to a desired thickness.

Figure 3B:
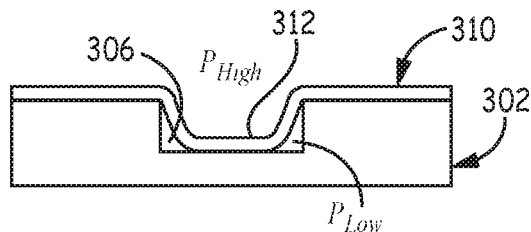

Thereafter, mold wafer 310 is heated past its softening point in a higher pressure environment ($P_{high}$) to create a differential pressure across mold wafer 310 over sealed cavity 306 at $P_{low}$. As illustrated in FIG. 3B, this results in a reflow portion 312 of mold wafer 310 being deflected into sealed cavity 306, with reflow portion 312 having a 3D mesa shape. The handle wafer 302 and mold wafer 310 are then cooled to harden reflow portion 312 in sealed cavity 306.

Figure 3C:
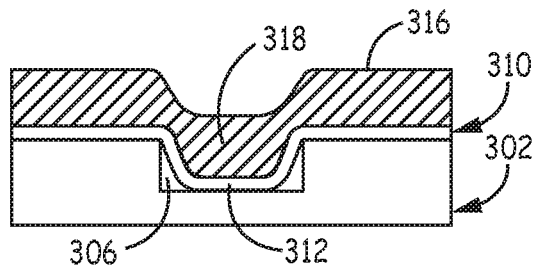
Figure 3D:
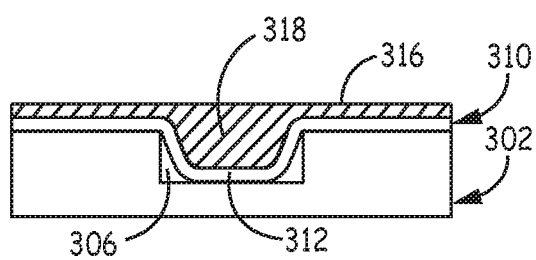

As depicted in FIG. 3C, a structure layer 316 is deposited on an outer surface of mold wafer 310 and over the hardened reflow portion 312 to form a 3D structure 318 that conforms to hardened reflow portion 312. The structure layer 316 can be formed by depositing one or more materials using various conventional deposition techniques. Optionally, structure layer 316 can be patterned after being formed if desired. In a further optional step shown in FIG. 3D, structure layer 316 can be ground, polished, and planarized to remove excess material of structure layer 316. A CMP process can be used to planarize and polish the excess material.

Thereafter, 3D structure 318 and mold wafer 310 on handle wafer 302 are bonded to a device wafer to produce a bonded structure, such as described previously for FIGS. 1F and 1G, and handle wafer 302 is removed from the bonded structure to expose 3D structure 318 on the device layer. Optionally, mold wafer 310 can also be removed from the bonded structure.

EXAMPLE EMBODIMENTS

Example 1 includes a method of fabricating one or more three-dimensional (3D) structures, the method comprising: forming a patterned area in a handle wafer; bonding a mold wafer over the patterned area to produce one or more sealed cavities having a first pressure in the handle wafer; heating the mold wafer past a softening point of the mold wafer at a second pressure different from the first pressure to create a differential pressure across the mold wafer over the one or more sealed cavities; cooling the mold wafer to harden the mold wafer into one or more 3D shapes over the one or more sealed cavities; depositing one or more materials on an outer surface of the mold wafer over the one or more 3D shapes to form a structure layer having one or more 3D structures that conform to the hardened one or more 3D shapes of the mold wafer; bonding the one or more 3D structures to a device wafer; and removing the handle wafer to expose the one or more 3D structures on the device wafer.

Example 2 includes the method of Example 1, wherein the handle wafer comprises silicon, glass, silicon on insulator (SOI), or a III-V semiconductor.

Example 3 includes the method of any of Examples 1-2, wherein the mold wafer comprises glass, a polymer material, or an oxide material.

Example 4 includes the method of any of Examples 1-3, wherein the first pressure is lower than the second pressure.

Example 5 includes the method of Example 4, wherein one or more reflow portions of the mold wafer are respectively deflected into the one more sealed cavities to form the one or more 3D shapes after heating the mold wafer.

Example 6 includes the method of any of Examples 1-3, wherein the first pressure is higher than the second pressure.

Example 7 includes the method of Example 6, wherein one or more reflow portions of the mold wafer are respectively deflected away from the one more sealed cavities to form the one or more 3D shapes after heating the mold wafer.

Example 8 includes the method of any of Examples 1-7, wherein the one or more materials comprise polysilicon, diamond, a metal, a ceramic, or a III-V semiconductor.

Example 9 includes the method of any of Examples 1-8, wherein the structure layer is patterned after being formed on the mold layer.

Example 10 includes the method of any of Examples 1-9, wherein the structure layer is ground, polished, and planarized after being formed on the mold layer.

Example 11 includes the method of any of Examples 1-10, wherein the device wafer is planarized and includes a device layer on which the one or more 3D structures are bonded.

Example 12 includes the method of Example 11, wherein the device layer comprises a photonic layer, a microfluidic chip, or a MEMS device.

Example 13 includes the method of any of Examples 1-12, further comprising removing the mold wafer after removal of the handle wafer.

Example 14 includes the method of any of Examples 1-13, wherein the one or more 3D structures comprise microlenses, optical manipulators, or microfluidic manipulators.

Example 15 includes a method of fabricating one or more 3D structures, the method comprising: forming a patterned area in a silicon handle wafer that includes one or more cavities; bonding a glass mold wafer over the patterned area such that the one or more cavities are sealed under a first pressure; heating the glass mold wafer past a softening point of the glass mold wafer at a second pressure different from the first pressure to create a differential pressure across the glass mold wafer over the one or more sealed cavities; cooling the glass mold wafer to harden the glass mold wafer into one or more 3D shapes over the one or more sealed cavities; depositing one or more materials on an outer surface of the glass mold wafer over the one or more 3D shapes to form a structure layer having one or more 3D structures that conform to the hardened one or more 3D shapes of the glass mold wafer; bonding the one or more 3D structures to a device wafer; and removing the silicon handle wafer and the glass mold wafer to expose the one or more 3D structures on the device wafer.

Example 16 includes the method of Example 15, wherein the first pressure is lower than the second pressure.

Example 17 includes the method of Example 16, wherein one or more reflow portions of the glass mold wafer are respectively deflected into the one more sealed cavities to form the one or more 3D shapes after heating the glass mold wafer.

Example 18 includes the method of Example 15, wherein the first pressure is higher than the second pressure.

Example 19 includes the method of Example 18, wherein one or more reflow portions of the glass mold wafer are respectively deflected away from the one more sealed cavities to form the one or more 3D shapes after heating the glass mold wafer.

Example 20 includes the method of any of Examples 15-19, wherein the one or more materials comprise polysilicon, diamond, a metal, a ceramic, or a III-V semiconductor.

The present invention may be embodied in other specific forms without departing from its essential characteristics. The described embodiments are to be considered in all respects only as illustrative and not restrictive. The scope of the invention is therefore indicated by the appended claims rather than by the foregoing description. All changes that come within the meaning and range of equivalency of the claims are to be embraced within their scope.

What is claimed is:

1. A method of fabricating one or more three-dimensional (3D) structures, the method comprising:
 forming a patterned area in a handle wafer;
 bonding a mold wafer over the patterned area to produce one or more sealed cavities having a first pressure in the handle wafer;

heating the mold wafer past a softening point of the mold wafer at a second pressure different from the first pressure to create a differential pressure across the mold wafer over the one or more sealed cavities;

cooling the mold wafer to harden the mold wafer into one or more 3D shapes over the one or more sealed cavities;

depositing one or more materials on an outer surface of the mold wafer over the one or more 3D shapes to form a structure layer having one or more 3D structures that conform to the hardened one or more 3D shapes of the mold wafer, wherein the structure layer is formed without reflowing the deposited one or more materials;

bonding the one or more 3D structures to a device wafer; and removing the handle wafer to expose the one or more 3D structures on the device wafer.

2. The method of claim 1, wherein the handle wafer comprises silicon, glass, silicon on insulator (SOI), or a III-V semiconductor.

3. The method of claim 1, wherein the mold wafer comprises glass, a polymer material, or an oxide material.

4. The method of claim 1, wherein the first pressure is lower than the second pressure.

5. The method of claim 4, wherein one or more reflow portions of the mold wafer are respectively deflected into the one or more sealed cavities to form the one or more 3D shapes after heating the mold wafer.

6. The method of claim 1, wherein the first pressure is higher than the second pressure.

7. The method of claim 6, wherein one or more reflow portions of the mold wafer are respectively deflected away from the one more sealed cavities to form the one or more 3D shapes after heating the mold wafer.

8. The method of claim 1, wherein the one or more materials comprise polysilicon, diamond, a metal, a ceramic, or a III-V semiconductor.

9. The method of claim 1, wherein the structure layer is patterned after being formed on the mold layer.

10. The method of claim 1, wherein the structure layer is ground, polished, and planarized after being formed on the mold layer.

11. The method of claim 1, wherein the device wafer is planarized and includes a device layer on which the one or more 3D structures are bonded.

12. The method of claim 1, wherein the device layer comprises a photonic layer, a microfluidic chip, or a microelectrical-mechanical systems (MEMS) device.

13. The method of claim 1, further comprising removing the mold wafer after removal of the handle wafer.

14. The method of claim 1, wherein the one or more 3D structures comprise microlenses, optical manipulators, or microfluidic manipulators.

15. A method of fabricating one or more three-dimensional (3D) structures, the method comprising:

forming a patterned area in a silicon handle wafer that includes one or more cavities;

bonding a glass mold wafer over the patterned area such that the one or more cavities are sealed under a first pressure;

heating the glass mold wafer past a softening point of the glass mold wafer at a second pressure different from the first pressure to create a differential pressure across the glass mold wafer over the one or more sealed cavities;

cooling the glass mold wafer to harden the glass mold wafer into one or more 3D shapes over the one or more sealed cavities;

depositing one or more materials on an outer surface of the glass mold wafer over the one or more 3D shapes to form a structure layer having one or more 3D structures that conform to the hardened one or more 3D shapes of the glass mold wafer, wherein the structure layer is formed without reflowing the deposited one or more materials;

bonding the one or more 3D structures to a device wafer; and removing the silicon handle wafer and the glass mold wafer to expose the one or more 3D structures on the device wafer.

16. The method of claim 15, wherein the first pressure is lower than the second pressure.

17. The method of claim 16, wherein one or more reflow portions of the glass mold wafer are respectively deflected into the one more sealed cavities to form the one or more 3D shapes after heating the glass mold wafer.

18. The method of claim 15, wherein the first pressure is higher than the second pressure.

19. The method of claim 18, wherein one or more reflow portions of the glass mold wafer are respectively deflected away from the one more sealed cavities to form the one or more 3D shapes after heating the glass mold wafer.

20. The method of claim 15, wherein the one or more materials comprise polysilicon, diamond, a metal, a ceramic, or a III-V semiconductor.

* * * * *